(12) United States Patent
Guo

(10) Patent No.: US 12,063,424 B2
(45) Date of Patent: Aug. 13, 2024

(54) PIXEL UNIT, PHOTOELECTRIC SENSOR, CAMERA MODULE AND ELECTRONIC DEVICE

(71) Applicant: VIVO MOBILE COMMUNICATION CO., LTD., Dongguan (CN)

(72) Inventor: Yuanming Guo, Dongguan (CN)

(73) Assignee: VIVO MOBILE COMMUNICATION CO., LTD., Dongguan (CN)

( * ) Notice: Subject to any disclaimer, the term of this patent is extended or adjusted under 35 U.S.C. 154(b) by 44 days.

(21) Appl. No.: 17/993,862

(22) Filed: Nov. 23, 2022

(65) Prior Publication Data

US 2023/0100569 A1    Mar. 30, 2023

Related U.S. Application Data

(63) Continuation of application No. PCT/CN2021/095530, filed on May 24, 2021.

(30) Foreign Application Priority Data

May 26, 2020  (CN) .......................... 202010456160.2

(51) Int. Cl.
  *H04N 23/16*    (2023.01)
  *G02B 27/10*    (2006.01)
  *H04N 23/55*    (2023.01)

(52) U.S. Cl.
  CPC ............. *H04N 23/16* (2023.01); *H04N 23/55* (2023.01); *G02B 27/1013* (2013.01)

(58) Field of Classification Search
  CPC .......... H04N 5/30; H04N 23/16; H04N 23/54; H04N 23/55; H04N 25/10;
  (Continued)

(56) References Cited

U.S. PATENT DOCUMENTS

| 5,340,978 A | * | 8/1994 | Rostoker ................ H04N 23/55 257/E27.134 |
| 10,727,263 B2 | * | 7/2020 | Li ..................... H01L 27/14621 |

(Continued)

FOREIGN PATENT DOCUMENTS

| CN | 101409299 A | 4/2009 |
| CN | 102160180 A | 8/2011 |

(Continued)

OTHER PUBLICATIONS

International Search Report issued in corresponding International Application No. PCT/CN2021/095530, mailed Aug. 9, 2021, 6 pages.

(Continued)

*Primary Examiner* — Lin Ye
*Assistant Examiner* — Chriss S Yoder, III
(74) *Attorney, Agent, or Firm* — IPX PLLC

(57) ABSTRACT

The pixel unit includes a base, the base being provided with an installation space; a photodiode, the photodiode being installed in the installation space, and the photodiode including a red photodiode, a green photodiode, and a blue photodiode that are spaced from each other; and an optical splitter, the optical splitter being installed on the base, at least part of the optical splitter being located in the installation space, the optical splitter having a light-in surface, a first light-out surface, a second light-out surface and a third light-out surface, and the optical splitter being configured to disperse light entering the light-in surface and then emit the light from the first light-out surface, the second light-out surface and the third light-out surface, where the first light-out surface faces the red photodiode, the second light-out surface faces the green photodiode, and the third light-out surface faces the blue photodiode.

13 Claims, 8 Drawing Sheets

(58) Field of Classification Search
CPC ......... H01L 27/14603; H01L 27/14607; H01L 27/14625; H01L 27/14645; G02B 5/201; G02B 27/10; G02B 27/1013; G02B 27/12
See application file for complete search history.

(56) References Cited

U.S. PATENT DOCUMENTS

| | | | |
|---|---|---|---|
| 2009/0096900 A1* | 4/2009 | Pang | H01L 27/14621 348/294 |
| 2014/0220713 A1 | 8/2014 | Dowski, Jr. et al. | |
| 2018/0182806 A1 | 6/2018 | Jin et al. | |

FOREIGN PATENT DOCUMENTS

| | | |
|---|---|---|
| CN | 102510447 A | 6/2012 |
| CN | 107861242 A | 3/2018 |
| CN | 109801933 A | 5/2019 |
| CN | 111614878 A | 9/2020 |
| JP | H11313334 A | 11/1999 |
| JP | 2001309395 A | 11/2001 |
| JP | 4846159 B2 | 12/2011 |
| JP | 2000151933 A | 5/2020 |
| KR | 20190085850 A | 7/2019 |
| KR | 20200023212 A | 3/2020 |

OTHER PUBLICATIONS

First Office Action issued in related Chinese Application No. 202010456160.2, , mailed Mar. 15, 2021, 8 pages.
Second Office Action issued in related Chinese Application No. 202010456160.2, , mailed Dec. 16, 2021, 3 pages.
Extended European Search Report issued in related European Application No. 21812616.7, mailed Feb. 21, 2024, 7 pages.
Office Action issued in related Korean Application No. 10-2022-7045489, mailed Mar. 21, 2024, 8 pages.

* cited by examiner

PIXEL UNIT, PHOTOELECTRIC SENSOR, CAMERA MODULE AND ELECTRONIC DEVICE

CROSS-REFERENCE TO RELATED APPLICATIONS

The present disclosure is a continuation of International Application No. PCT/CN2021/095530, filed on May 24, 2021, which claims priority to Chinese Patent Application No. 202010456160.2, filed on May 26, 2020. The entire contents of each of the above-identified applications are expressly incorporated herein by reference.

TECHNICAL FIELD

The present disclosure relates to the field of photoelectric technologies, and in particular, to a pixel unit, a photoelectric sensor, a camera module and an electronic device.

BACKGROUND

Currently, a photoelectric sensor in a camera senses light similarly to human eyes. A Red-Green-Blue (RGB) Color Filer Array (CFA) covering pixels of the photoelectric sensor simulates three types of cone cells of the human eyes, and samples a spectral reflection curve to form a digital signal, which is processed by Image Signal Processing (ISP) and finally becomes an image.

The photoelectric sensor senses light differently from the human eyes in that each pixel in the photoelectric sensor can acquire only one of R, G and B signals, while the cone cells of the human eyes are densely distributed, which may be equivalently understood as that each pixel simultaneously acquires R, G and B signals. The use of the above photoelectric sensor may lead to false colors in the generated image relative to details of the image perceived by the human eyes. That is, serious artificial traces such as color fringing and other false color effects may be produced in the image.

Therefore, how to eliminate the false color effects of the photoelectric sensor has become an urgent technical problem.

SUMMARY

Embodiments of the present disclosure is to provide a pixel unit, a photoelectric sensor, a camera module, and an electronic device.

According to a first aspect, an embodiment of the present disclosure provides a pixel unit, including:

a base, the base being provided with an installation space;

a photodiode, the photodiode being installed in the installation space, and the photodiode including a red photodiode, a green photodiode, and a blue photodiode that are spaced from each other; and an optical splitter, the optical splitter being installed on the base, at least part of the optical splitter being located in the installation space, the optical splitter having a light-in surface, a first light-out surface, a second light-out surface and a third light-out surface, and the optical splitter being configured to disperse light entering the light-in surface and then emit the light from the first light-out surface, the second light-out surface and the third light-out surface, where the first light-out surface faces the red photodiode, the second light-out surface faces the green photodiode, and the third light-out surface faces the blue photodiode.

In some implementations, the base includes:

a bottom plate, a first lateral panel, a second lateral panel, a third lateral panel and a fourth lateral panel, the first lateral panel, the second lateral panel, the third lateral panel and the fourth lateral panel being successively connected into a ring shape, and the first lateral panel, the second lateral panel, the third lateral panel and the fourth lateral panel being respectively connected to edges of the bottom plate, the installation space is formed among the bottom plate, the first lateral panel, the second lateral panel, the third lateral panel and the fourth lateral panel, and the photodiode and the optical splitter are both installed in the installation space.

In some implementations, the base includes:

a bottom plate, a first lateral panel and a third lateral panel, the first lateral panel and the third lateral panel being arranged opposite each other and both connected to edges of the bottom plate, the installation space is formed among the bottom plate, the first lateral panel and the third lateral panel, the installation space is a concave structure, and the photodiode and the optical splitter are both installed in the installation space.

In some implementations, the bottom plate, the first lateral panel and the third lateral panel are respectively provided with one of the red photodiode, the green photodiode and the blue photodiode.

In some implementations, a cross section of the optical splitter is in the shape of a trapezoid, a surface in which one base of the trapezoid is located forms the light-in surface, and a surface in which the other base of the trapezoid is located and surfaces in which two legs of the trapezoid are located form one of the first light-out surface, the second light-out surface and the third light-out surface respectively.

In some implementations, the installation space has a light transmission port communicated with the outside, the optical splitter is installed in the installation space, and the cross section of the optical splitter is in the shape of an isosceles trapezoid, the isosceles trapezoid having a lower base facing the light transmission port.

In some implementations, the base is a silicone member.

According to a second aspect, an embodiment of the present disclosure provides a photoelectric sensor, including:

a pixel unit, the pixel unit being the pixel unit as described in the first aspect; and a photosensitive control circuit, the photosensitive control circuit including a first photosensitive control circuit, a second photosensitive control circuit and a third photosensitive control circuit, the red photodiode, the green photodiode and the blue photodiode being respectively connected to the first photosensitive control circuit, the second photosensitive control circuit and the third photosensitive control circuit to respectively convert received optical signals into electrical signals.

In some implementations, the photosensitive control circuit is disposed on the base.

In some implementations, the photoelectric sensor includes a plurality of pixel units, the plurality of pixel units being connected and arranged in an array, where the pixel unit is the pixel unit as described in the first aspect.

In some implementations, adjacent pixel units share the base.

According to a third aspect, an embodiment of the present disclosure provides a camera module, including: a circuit board, a lens, and a photoelectric sensor, the photoelectric sensor being installed on the circuit board and electrically connected to the circuit board, the photoelectric sensor being the photoelectric sensor as described in the second aspect; and the lens being disposed on one side of the photoelectric sensor away from the circuit board.

According to a fourth aspect, an embodiment of the present disclosure provides an electronic device, including the camera module as described in the third aspect.

BRIEF DESCRIPTION OF THE DRAWINGS

The following introduces the accompanying drawings required for describing the embodiments or the prior art. Apparently, the accompanying drawings in the following descriptions show merely some embodiments of the present disclosure, and a person of ordinary skill in the art may still derive other accompanying drawings from these accompanying drawings without creative efforts.

DESCRIPTION OF REFERENCE NUMERALS

100: pixel unit, 101: base, 1010: bottom plate, 1011: first lateral panel, 1012: second lateral panel, 1013: third lateral panel, 1014: fourth lateral panel, 1021: red photodiode, 1022: green photodiode, 1023: blue photodiode, 103: optical splitter, 1031: light-in surface, 1032: first light-out surface, 1033: second light-out surface, 1034: third light-out surface, 200: photoelectric sensor, 301: lens, 302: motor, 303: filter, 304: pedestal, 305: circuit board.

DETAILED DESCRIPTION

The embodiments of the present disclosure provide a pixel unit, a photoelectric sensor, a camera module, and an electronic device.

The following describes the technical solutions in the embodiments of the present disclosure with reference to the accompanying drawings in the embodiments of the present disclosure. Apparently, the described embodiments are merely some but not all of the embodiments of the present disclosure. All other embodiments obtained by a person of ordinary skill in the art based on the embodiments of the present disclosure shall fall within the protection scope of the present disclosure.

Figure 1:
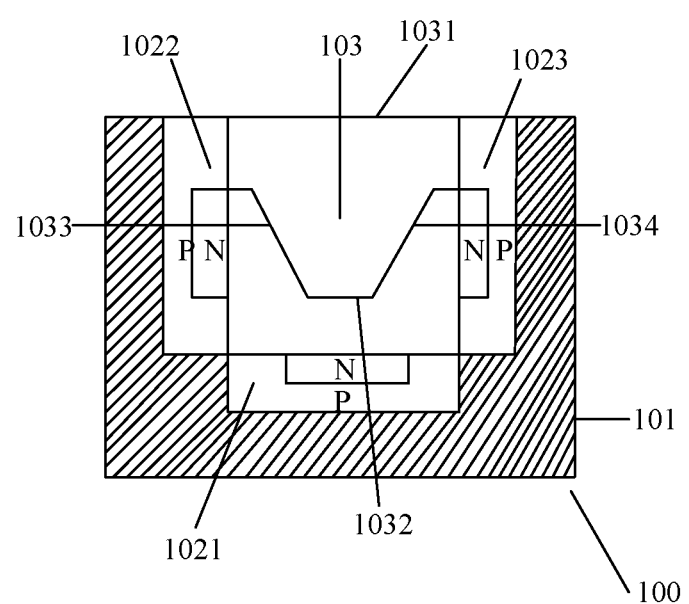
FIG. 1 is a sectional view of a pixel unit according to an embodiment of the present disclosure.

An embodiment of the present disclosure provides a pixel unit. As shown in FIG. 1, FIG. 1 is a front sectional view of a pixel unit 100 according to an embodiment of the present disclosure, including a base 101, a red photodiode 1021, a blue photodiode 1023, a green photodiode 1022 and an optical splitter 103. The base 101 is provided with an installation space. The red photodiode 1021, the blue photodiode 1023 and the green photodiode 1022 are installed in the installation space. The optical splitter 103 is installed on the base. At least part of the optical splitter 103 is located in the installation space. The optical splitter 103 has a light-in surface 1031, a first light-out surface 1032, a second light-out surface 1033 and a third light-out surface 1034. The optical splitter 103 is configured to disperse light entering the light-in surface and then emit the light from the first light-out surface 1032, the second light-out surface 1033 and the third light-out surface 1034. The first light-out surface 1032 faces the red photodiode 1021, the second light-out surface 1033 faces the green photodiode 1022, and the third light-out surface 1034 faces the blue photodiode 1023. In this way, light passing through the optical splitter 103 is divided into three beams of light in different directions, which respectively enter the red photodiode 1021, the green photodiode 1022 and the blue photodiode 1023, so that the pixel unit 100 can simultaneously acquire R, G and B signals, effectively eliminating the false color effects of the photoelectric sensor.

Figure 2:
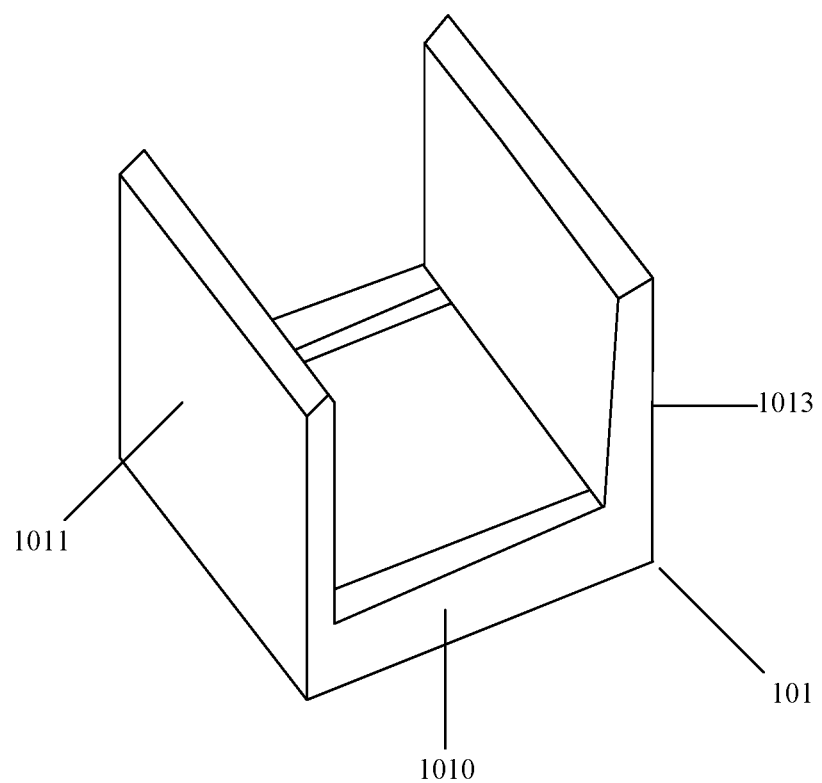
FIG. 2 is a schematic structural diagram of a first base according to an embodiment of the present disclosure.

Further, as shown in FIG. 2, the base 101 may be a concave structure with two lateral panels and a bottom plate 1010. The two lateral panels may include a first lateral panel 1011 and a third lateral panel 1013. The first lateral panel 1011 and the third lateral panel 1013 are arranged opposite each other and both connected to edges of the bottom plate 1010. The installation space is formed among the bottom plate 1010, the first lateral panel 1011 and the third lateral panel 1013. The installation space may be a concave structure. The photodiode and the optical splitter are both installed in the installation space.

Figure 3:
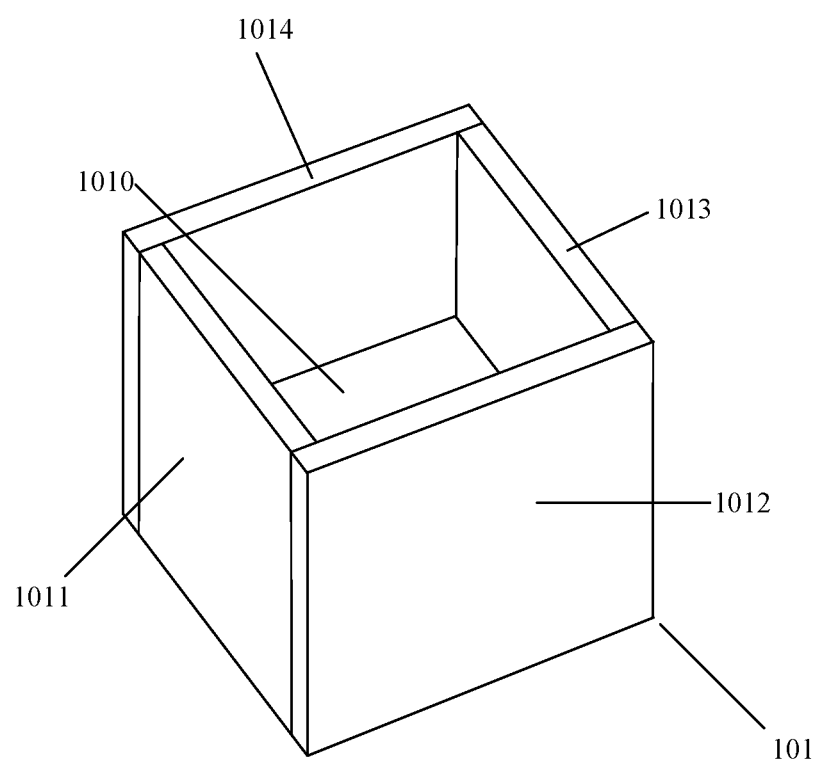
FIG. 3 is a schematic structural diagram of a second base according to an embodiment of the present disclosure.

In some implementations, as shown in FIG. 3, the base 101 may further include a bottom plate 1010 and four lateral panels. The four lateral panels may include a first lateral panel 1011, a second lateral panel 1012, a third lateral panel 1013 and a fourth lateral panel 1014. The first lateral panel 1011, the second lateral panel 1012, the third lateral panel 1013 and the fourth lateral panel 1014 are successively connected into a ring shape, and the first lateral panel 1011, the second lateral panel 1012, the third lateral panel 1013 and the fourth lateral panel 1014 are respectively connected to edges of the bottom plate 1010. The installation space is formed among the bottom plate 1010, the first lateral panel 1011, the second lateral panel 1012, the third lateral panel 1013 and the fourth lateral panel 1014. The photodiode and the optical splitter are both installed in the installation space.

In some implementations, the base may further include a bottom plate and a plurality of lateral panels. The plurality of lateral panels are successively connected into a ring shape, and the plurality of lateral panels are respectively connected to edges of the bottom plate. The installation space may be formed among the bottom plate and the plurality of lateral panels. The photodiode and the optical splitter are both installed in the installation space. The plurality of lateral panels may be five lateral panels, six lateral panels, or the like. A quantity of the lateral panels is not specifically limited in this embodiment of this application.

In some implementations, the bottom plate, the first lateral panel and the third lateral panel are respectively provided with one of the red photodiode, the green photodiode and the blue photodiode.

In some implementations, the red photodiode may be installed on an inner wall of the first lateral panel, the blue photodiode may be installed on an inner wall of the third lateral panel, and the green photodiode may be installed on an inner wall of the bottom plate. In some implementations, the red photodiode may be installed on an inner wall of the bottom plate, the blue photodiode may be installed on an inner wall of the first lateral panel, and the green photodiode may be installed on an inner wall of the third lateral panel. A mounting installation position of the photodiode installed on the base is not specifically limited in this embodiment of this application.

A structure of the optical splitter 103 is related to a specific position of the photodiode installed on the base 101. The installation space in the base 101 has a light transmission port communicated with the outside. The optical splitter 103 may be installed inside the installation space to disperse light passing through the optical splitter 103 into three beams of light in different directions, which are respectively incident into three photodiodes installed in the installation space.

In some implementations, for example, the base includes a bottom plate and four lateral panels. In the red photodiode, the green photodiode and the blue photodiode, one is installed on the bottom plate, one is installed on the first lateral panel, and another is installed on the third lateral panel. A cross section of the optical splitter may be in the shape of a trapezoid, a surface in which one base of the trapezoid is located may form the light-in surface, and a surface in which the other base of the trapezoid is located and surfaces in which two legs of the trapezoid are located may form one of the first light-out surface, the second light-out surface and the third light-out surface respectively.

Further, the installation space may have a light transmission port communicated with the outside, the optical splitter is installed in the installation space, the cross section of the optical splitter may be in the shape of an isosceles trapezoid, and the isosceles trapezoid has a lower base facing the light transmission port.

Figure 4:
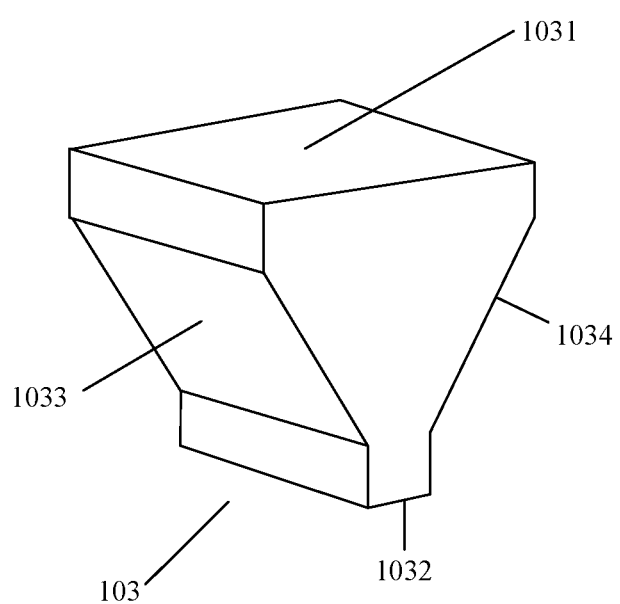
FIG. 4 is a schematic structural diagram of an optical splitter according to an embodiment of the present disclosure.

In some implementations, for example, the base includes a bottom plate and four lateral panels, and the bottom plate, the first lateral panel and the third lateral panel are respectively provided with one of the red photodiode, the green photodiode and the blue photodiode. As shown in FIG. 4, FIG. 4 is a schematic structural diagram of an optical splitter 103 according to an embodiment of the present disclosure. A structure of the optical splitter 103 corresponding to the base 101 is a structure of an isosceles trapezoid, including a light-in surface 1031, a first light-out surface 1032, a second light-out surface 1033 and a third light-out surface 1034. A lower base of the isosceles trapezoid (i.e., the light-in surface 1031) faces the light transmission port, and an upper base of the isosceles trapezoid (i.e., the first light-out surface 1032) is at an angle of 45 degrees respectively with the second light-out surface 1033 and the third light-out surface 1034. The second light-out surface 1033 and the third light-out surface 1034 are used for refracting light passing through the light-in surface 1031 and hitting the second light-out surface 1033 and the third light-out surface 1034 to 90 degrees to cause the light to enter the photodiodes corresponding to the second light-out surface 1033 and the third light-out surface 1034 and located in the installation space. The light passing through the first light-out surface 1032 enters the photodiode located on the bottom plate in the installation space.

Figure 5:
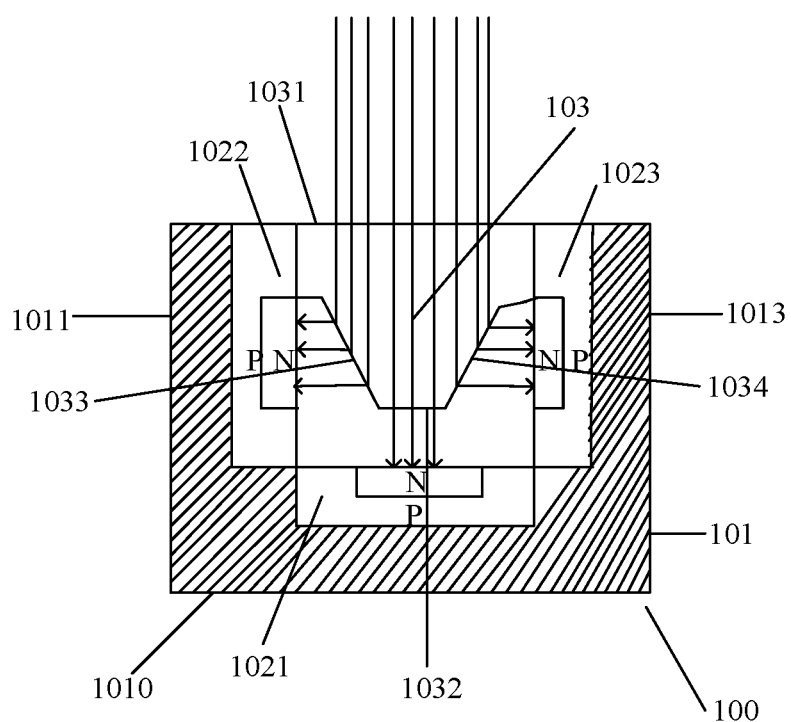
FIG. 5 is a schematic diagram of an implementation principle of optical splitting of an optical splitter according to an embodiment of the present disclosure.

As shown in FIG. 5, the light may enter the installation space inside the base 101 through the light-in surface 1031 of the optical splitter 103. The light passing through the first light-out surface 1032 may directly enter the red photodiode 1021 located on the bottom plate 1010 of the base. The light passing through the second light-out surface 1033 and the third light-out surface 1034 of the optical splitter 103 may be refracted to an angle of 90 degrees by the second light-out surface 1033 and the third light-out surface 1034, so as to enter the green photodiode 1022 on the first lateral panel 1011 and the blue photodiode 1023 on the third lateral panel 1013 of the base 101 that correspond to the second light-out surface 1033 and the third light-out surface 1034.

Further, the base may be a silicone member.

Some embodiments of the present disclosure provide a pixel unit. The pixel unit includes a base, the base being provided with an installation space; a photodiode, the photodiode being installed in the installation space, and the photodiode including a red photodiode, a green photodiode, and a blue photodiode that are spaced from each other; and an optical splitter, the optical splitter being installed on the base, at least part of the optical splitter being located in the installation space, the optical splitter having a light-in surface, a first light-out surface, a second light-out surface and a third light-out surface, and the optical splitter being configured to disperse light entering the light-in surface and then emit the light from the first light-out surface, the second light-out surface and the third light-out surface, where the first light-out surface faces the red photodiode, the second light-out surface faces the green photodiode, and the third light-out surface faces the blue photodiode. In this way, light passing through the optical splitter is divided into three beams of light in different directions, which respectively enter the red photodiode, the green photodiode and the blue photodiode, so that the pixel unit can simultaneously acquire R, G and B signals, effectively eliminating the false color effects of the photoelectric sensor.

Figure 6:
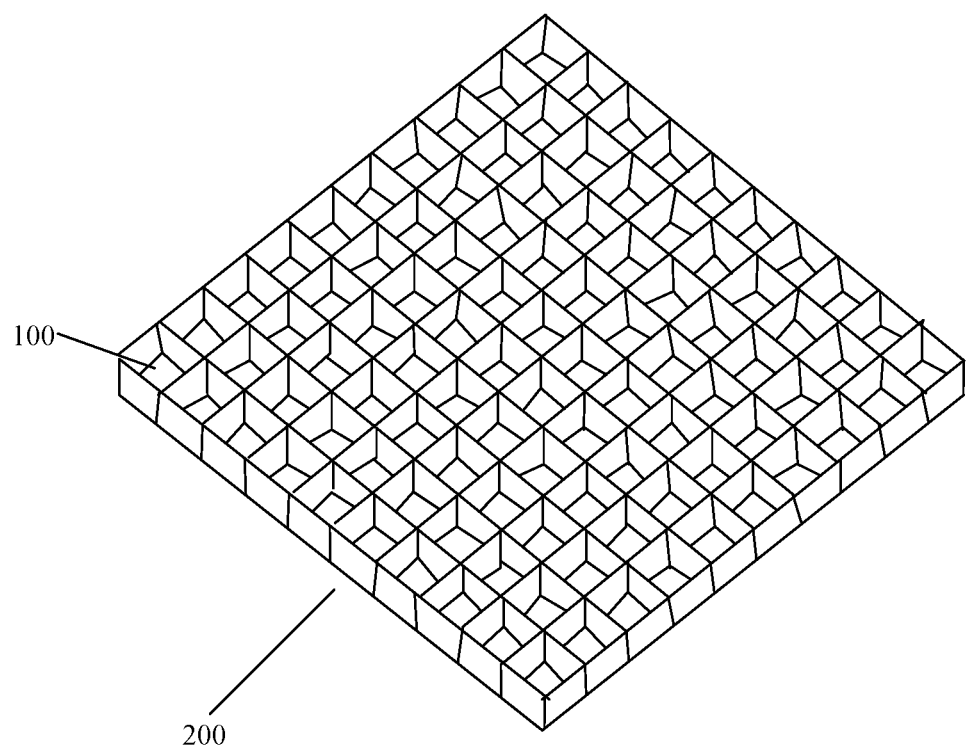
FIG. 6 is a schematic structural diagram of a photoelectric sensor according to an embodiment of the present disclosure.

Based on the pixel unit disclosed in the embodiments of this application, some embodiments of this application further provide a photoelectric sensor. As shown in FIG. 6, FIG. 6 shows a photoelectric sensor 200 according to embodiments of the present disclosure. The photoelectric sensor 200 may include a plurality of pixel units 100 as described in the above embodiments. The plurality of pixel units 100 are connected and arranged in an array. The photoelectric sensor 200 is a concave arrangement structure. It may be understood by a person skilled in the art that the pixel units 100 forming the photoelectric sensor 200 are different, a quantity of the pixel units 100 varies, the pixel units 100 are arranged differently, and therefore the concave arrangement structure forming the photoelectric sensor 200 may also be varied, which is not limited in this embodiment.

Further, the photoelectric sensor may include a pixel unit and a photosensitive control circuit. The pixel unit may be any pixel unit in the above embodiment. The photosensitive control circuit may include a first photosensitive control circuit, a second photosensitive control circuit and a third photosensitive control circuit. The red photodiode, the green photodiode and the blue photodiode are respectively connected to the first photosensitive control circuit, the second photosensitive control circuit and the third photosensitive control circuit to respectively convert received optical signals into electrical signals.

Further, the photosensitive control circuit is disposed on the base. The photosensitive control circuit may be a metallic circuit.

In some implementations, the base may include the photosensitive control circuit (e.g., the metallic circuit). The photosensitive control circuit is connected to the photodiode to convert received analog electrical signals converted by the photodiode into digital signals.

In some implementations, in the implementation, the red photodiode may acquire red light (with different wavelengths) and may convert optical signals of the red light with different intensity into analog electrical signals with different intensity, the green photodiode may acquire green light (with different wavelengths) and may convert optical signals of the green light with different intensity into analog electrical signals with different intensity, and the blue photodiode may acquire blue light (with different wavelengths) and may convert optical signals of the blue light with different intensity into analog electrical signals with different intensity. The base may further include the photosensitive control circuit (e.g., the metallic circuit). The photosensitive control circuit may include a first photosensitive control circuit, a second photosensitive control circuit and a third photosensitive control circuit. The red photodiode, the green photodiode and the blue photodiode are respectively connected to the first photosensitive control circuit, the second photosensitive control circuit and the third photosensitive control circuit to respectively convert received optical signals into electrical signals.

In some implementations, adjacent pixel units share the base.

In some implementations, only one lateral panel may be provided between two adjacent pixel units. The lateral panel is provided with the photosensitive control circuit of the two adjacent pixel units.

As can be seen from the above technical solution according to embodiments of the present disclosure, some embodiments of the present disclosure provides a photoelectric sensor. The photoelectric sensor includes a plurality of pixel units. The pixel units each may include a base, the base being provided with an installation space; a photodiode, the photodiode being installed in the installation space, and the photodiode including a red photodiode, a green photodiode, and a blue photodiode that are spaced from each other; and an optical splitter, the optical splitter being installed on the base, at least part of the optical splitter being located in the installation space, the optical splitter having a light-in surface, a first light-out surface, a second light-out surface and a third light-out surface, and the optical splitter being configured to disperse light entering the light-in surface and then emit the light from the first light-out surface, the second light-out surface and the third light-out surface, where the first light-out surface faces the red photodiode, the second light-out surface faces the green photodiode, and the third light-out surface faces the blue photodiode. In this way, light passing through the optical splitter is divided into three beams of light in different directions, which respectively enter the red photodiode, the green photodiode and the blue photodiode, so that the pixel unit can simultaneously acquire R, G and B signals, effectively eliminating the false color effects of the photoelectric sensor.

Further, since the photoelectric sensor may be formed by the pixel unit in the above embodiment, the photoelectric sensor is a concave arrangement structure, which can effectively increase a photosensitive area on the photoelectric sensor of a same size, so that the photoelectric sensor can acquire more saturated image information to further reduce image distortion, effectively improving the performance of the photoelectric sensor.

Figure 7:
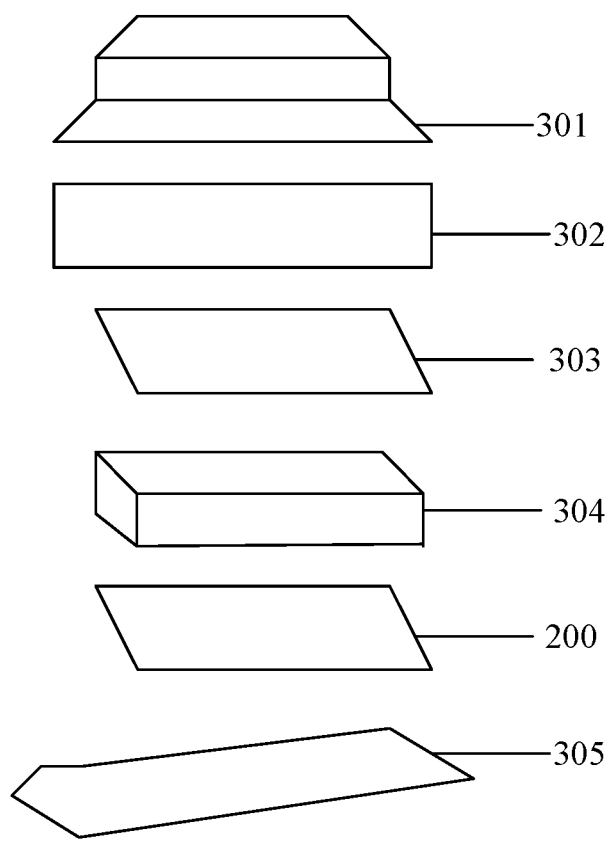
FIG. 7 is a schematic structural diagram of a camera module according to an embodiment of the present disclosure.

Based on the photoelectric sensor disclosed in this embodiment of this application, an embodiment of this application further provides a camera module. As shown in FIG. 7, the camera module may include the photoelectric sensor 200 described in the above embodiment, a lens 301, and a circuit board 305. The photoelectric sensor 200 is installed on the circuit board 305 and electrically connected to the circuit board 305. The photoelectric sensor 200 is the photoelectric sensor described in the above embodiment. The lens 301 is disposed on one side of the photoelectric sensor 200 away from the circuit board 305.

Further, in order to improve shooting performance, the camera module disclosed in this embodiment of this application further includes a filter 303. The filter 303 is located above the photoelectric sensor 200 to filter out excess infrared light and ultraviolet light. The filter 303 may also be a color filter.

In some implementations, part of the light incident through the lens 301 may pass through the filter 303 before being projected to the photoelectric sensor 200. The filter 303 can filter light to filter out excess infrared light and ultraviolet light, so as to filter out unwanted light from a photosensitive region of the photoelectric sensor 200, prevent formation of false colors or moiré by the photoelectric sensor 200 during the shooting, and then improve effective resolution and color reduction of an image.

Further, the camera module disclosed in this embodiment of this application may further include a motor 302. The motor 302 is connected to the lens 301 to drive the lens 301 to move.

In some implementations, the motor 302 may be located below the lens 301, and connected to a drive device on the lens 301 to drive the lens 301 to move. The motor 302 may be a zoom motor, so that the zoom motor can realize a zoom function in the process of driving the lens to move. The motor 302 may also be of another type. The type of the motor is not specifically limited in this embodiment of this application.

Further, the camera module disclosed in this embodiment of this application may further include a pedestal 304. The pedestal 304 is located above the circuit board 305. The motor 302 is disposed on the pedestal 304.

Some embodiments of the present disclosure provide a camera module. The camera module includes a photoelectric sensor. The photoelectric sensor includes a plurality of pixel units. The pixel units each may include a base, the base being provided with an installation space; a photodiode, the photodiode being installed in the installation space, and the photodiode including a red photodiode, a green photodiode, and a blue photodiode that are spaced from each other; and an optical splitter, the optical splitter being installed on the base, at least part of the optical splitter being located in the installation space, the optical splitter having a light-in surface, a first light-out surface, a second light-out surface and a third light-out surface, and the optical splitter being configured to disperse light entering the light-in surface and then emit the light from the first light-out surface, the second light-out surface and the third light-out surface, where the first light-out surface faces the red photodiode, the second light-out surface faces the green photodiode, and the third light-out surface faces the blue photodiode. In this way, light passing through the optical splitter is divided into three beams of light in different directions, which respectively enter the red photodiode, the green photodiode and the blue photodiode, so that the pixel unit can simultaneously acquire R, G and B signals, effectively eliminating the false color effects of the photoelectric sensor.

Figure 8:
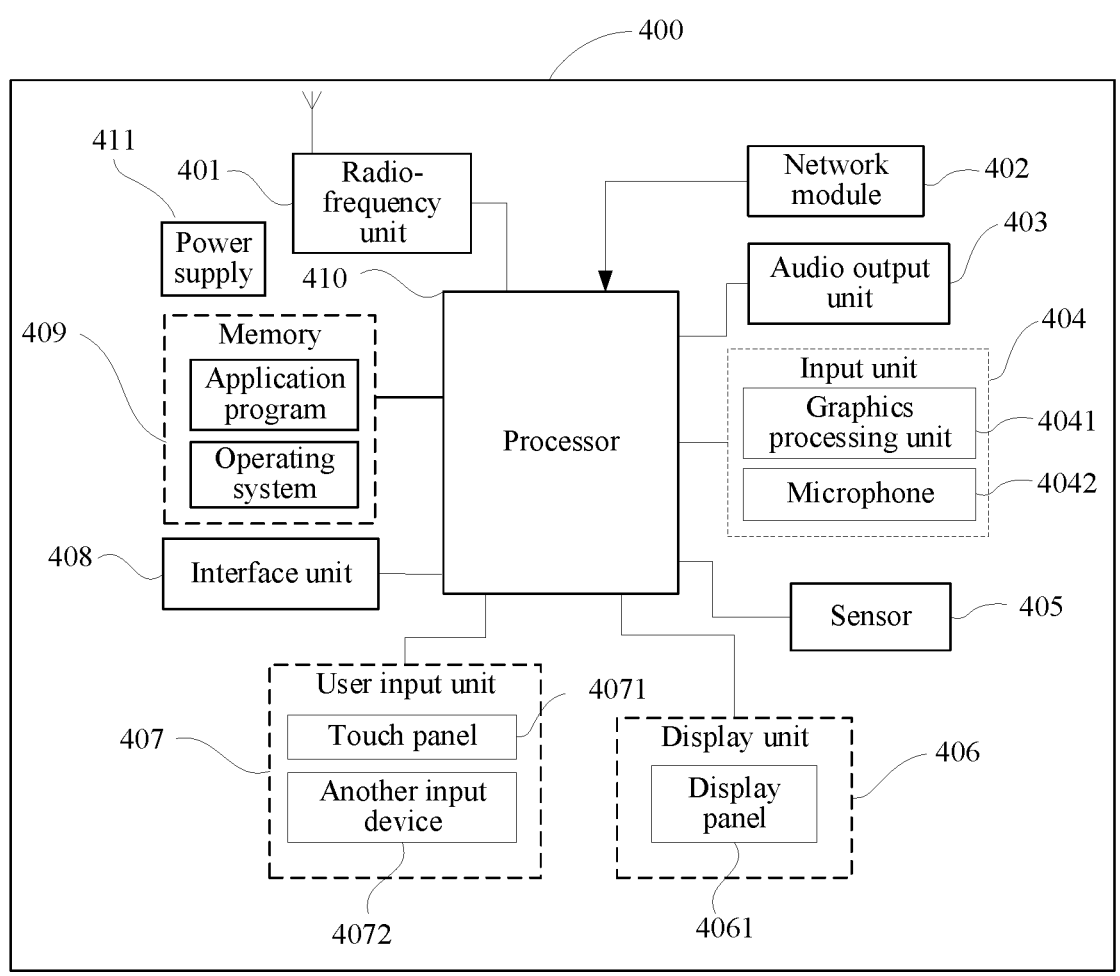
FIG. 8 is a schematic structural diagram of an electronic device according to an embodiment of the present disclosure.

Some embodiments of this application further provide an electronic device. The disclosed electronic device includes the camera module described in the above embodiments. As shown in FIG. 8, FIG. 8 is a schematic diagram of a hardware structure of an electronic device according to embodiments of the present disclosure. The electronic device may include the camera module in the above embodiments. The electronic device includes, but is not limited to, components such as a radio-frequency unit 401, a network module 402, an audio output unit 403, an input unit 404, a sensor 405, a display unit 406, a user input unit 407, an interface unit 408, a memory 409, a processor 410, and a power supply 411. It may be understood by a person skilled in the art that the structure of the electronic device shown in FIG. 8 does not constitute a limitation on the electronic device. The electronic device may include more or fewer components than those illustrated, some components may be combined, or a different component arrangement may be used. In the embodiments of the present disclosure, the electronic device includes, but is not limited to, a mobile phone, a tablet computer, a notebook computer, a handheld computer, a vehicle-installed computer, a wearable device, a pedometer, and the like.

The electronic device includes a camera module. The camera module includes a circuit board, a lens, and the photoelectric sensor as described in the above embodiment. The photoelectric sensor is installed on the circuit board and electrically connected to the circuit board. The photoelectric sensor is the photoelectric sensor described in the above embodiment. The lens is disposed on one side of the photoelectric sensor away from the circuit board.

Some embodiments of the present disclosure provide an electronic device. The electronic device includes a camera module. The camera module includes a photoelectric sensor. The photoelectric sensor includes a plurality of pixel units. The pixel units each may include a base, the base being provided with an installation space; a photodiode, the photodiode being installed in the installation space, and the photodiode including a red photodiode, a green photodiode, and a blue photodiode that are spaced from each other; and an optical splitter, the optical splitter being installed on the base, at least part of the optical splitter being located in the installation space, the optical splitter having a light-in surface, a first light-out surface, a second light-out surface and a third light-out surface, and the optical splitter being configured to disperse light entering the light-in surface and then emit the light from the first light-out surface, the second light-out surface and the third light-out surface, where the first light-out surface faces the red photodiode, the second light-out surface faces the green photodiode, and the third light-out surface faces the blue photodiode. In this way, light passing through the optical splitter is divided into three beams of light in different directions, which respectively enter the red photodiode, the green photodiode and the blue photodiode, so that the pixel unit can simultaneously acquire R, G and B signals, effectively eliminating the false color effects of the photoelectric sensor.

It should be understood that, in this embodiment of the present disclosure, the radio frequency unit 401 may be configured to receive and send a signal during an information receiving and sending process or a call process. In some implementations, the radio frequency unit receives downlink data from a base station, then delivers the downlink information to the processor 410 for processing, and sends related uplink data to the base station. In some implementations, the radio frequency unit 401 includes, but is not limited to, an antenna, at least one amplifier, a transceiver, a coupler, a low noise amplifier, a duplexer, and the like. In addition, the radio frequency unit 401 may further communicate with the network and another device through wireless communication system.

The electronic device provides the user with wireless broadband Internet access in a network module 402, such as helping the user to send and receive emails, browse web pages, and access streaming media.

The audio output unit 403 may convert audio data received by the radio frequency unit 401 or the network module 402 or stored in the memory 409 into an audio signal and output the audio signal as sound. In addition, the audio output unit 403 may further provide an audio output that is related to a particular function executed by the electronic device 400 (for example, a call signal receiving sound or a message receiving sound). The audio output unit 403 includes a speaker, a buzzer, a receiver, and the like.

The input unit 404 is configured to receive an audio or video signal. The input unit 404 may include a Graphics Processing Unit (GPU) 4041 and a microphone 4042. The graphics processing unit 4041 performs processing on image data of a static picture or a video that is obtained by an image acquisition device (for example, a camera) in a video acquisition mode or an image acquisition mode. The processed image frame can be displayed on the display unit 406. An image frame that has been processed by the graphics processing unit 4041 may be stored in the memory 409 (or another storage medium) or sent by using the radio frequency unit 401 or the network module 402. The microphone 4042 may receive a sound, and can process the sound into audio data. The processed audio data may be transferred, in a phone talk mode, to a format that may be sent to a mobile communication base station via the radio frequency unit 401 to output.

The electronic device 400 further includes at least one sensor 405, such as an optical sensor, a motion sensor, and other sensors. Specifically, the optical sensor includes an ambient light sensor and a proximity sensor, where the ambient light sensor may adjust luminance of the display panel 4061 according to the luminance of the ambient light, and the proximity sensor may switch off the display panel 4061 and/or backlight when the electronic device 400 is moved to the ear. As one type of motion sensor, an acceleration sensor may detect magnitude of accelerations in various directions (which generally are triaxial), may detect magnitude and a direction of the gravity when static, and may be configured to identify an electronic device gesture (such as switchover between horizontal and vertical screens, a related game, and gesture calibration of a magnetometer), a related function of vibration identification (such as a pedometer and a knock). The sensor 405 may also include a fingerprint sensor, a pressure sensor, an iris sensor, a molecular sensor, a gyroscope, a barometer, a hygrometer, a thermometer, an infrared sensor, and the like, which are not be described herein again.

The display unit 406 is configured to display information input by the user or information provided for the user. The display unit 406 may include a display panel 4061, and the display panel 4061 may be configured by using a Liquid Crystal Display (LCD), an Organic Light-Emitting Diode (OLED), or the like.

The user input unit 407 may be configured to receive input digit or character information, and generate key signal input related to the user setting and function control of the electronic device. In some implementations, the user input unit 407 includes a touch panel 4071 and another input device 4072. The touch panel 4071, also referred to as a touchscreen, may collect a touch operation of a user on or near the touch panel (such as an operation by a user on or near the touch panel 4071 by using any suitable object or attachment, such as a finger or a touch pen). The touch panel 4071 may include two parts: a touch detection apparatus and a touch controller. The touch detection apparatus detects a touch position of the user, detects a signal generated by the touch operation, and transfers the signal to the touch controller. The touch controller receives the touch information from the touch detection apparatus, converts the touch information into touch point coordinates, sends the touch point coordinates to the processor 410, and receives and executes a command sent from the processor 410. In addition, the touch panel 4071 may be implemented by using various types, such as a resistive type, a capacitive type, an infrared type, and a surface acoustic wave type. In addition to the touch panel 4071, the user input unit 407 may further include the another input device 4072. In some implementations, the another input device 4072 may include, but is not limited to, a physical keyboard, a functional key (such as a volume control key or a switch key), a track ball, a mouse, and a joystick, which are not repeated herein.

Further, the touch panel 4071 may cover the display panel 4061. After detecting a touch operation on or near the touch panel, the touch panel 4071 transfers the touch operation to the processor 410, to determine a type of a touch event. Then, the processor 410 provides a corresponding visual output on the display panel 4061 according to the type of the touch event. In FIG. 7, the touch panel 4071 and the display panel 4061 implement, as two independent parts, input and output functions of the electronic device. However, in some embodiments, the touch panel 4071 and the display panel 4061 may be integrated to implement the input and output functions of the electronic device, which is not specifically limited herein.

The interface unit 408 is an interface for connecting an external apparatus to the electronic device 400. For example, the external apparatus may include a wired or wireless headset port, an external power supply (or battery charger) port, a wired or wireless data port, a memory card port, a port for connecting an apparatus with a recognition module, an audio Input/Output (I/O) port, a video I/O port, a headphone port, and the like. The interface unit 408 may be configured to receive an input (for example, data information or power) from an external apparatus, and transmit the received input to one or more elements in the electronic device 400, or may be configured to transmit data between the electronic device 400 and the external apparatus.

The memory 409 may be configured to store a software program and various data. The memory 409 may mainly include a program storage area and a data storage area. The program storage area may store an operating system, an application program required by at least one function (for example, a sound playback function and an image display function), and the like. The data storage area may store data (for example, audio data and an address book) created according to the use of the mobile phone, and the like. In addition, the memory 409 may include a high-speed random access memory, and may also include a nonvolatile memory, for example, at least one magnetic disk storage device, a flash memory, or another volatile solid-state storage device.

The processor 410 is a control center of the electronic device, and connects various parts of the entire electronic device by using various interfaces and lines. By running or executing the software program and/or module stored in the memory 409, and invoking data stored in the memory 409, the processor 410 performs various functions of the electronic device and processes data, thereby performing overall monitoring on the electronic device. The processor 410 may include one or more processing units. Preferably, the processor 410 may integrate an application processor and a modem processor. The application processor mainly processes an operating system, a user interface, an application program, and the like. The modem processor mainly processes wireless communication. It may be understood that, the modem processor may alternatively not be integrated in the processor 410.

The electronic device 400 may further include the power supply 411 (such as a battery) for supplying power to the components. Preferably, the power supply 411 may logically connect to the processor 410 by using a power supply management system, thereby implementing functions, such as charging, discharging, and power consumption management, by using the power supply management system.

In addition, the electronic device 400 includes some functional modules not shown, which are not described herein again.

In some implementations, the embodiments of the present disclosure further provide an electronic device, including a processor 410, a memory 409, and a computer program on the memory 409 and executed on the processor 410, where when executed by the processor 410, the computer program implements the processes of the embodiments, and can achieve the same technical effects. To avoid repetition, details are not described herein again.

A person skilled in the art should understand that the embodiments of the present disclosure may be provided as a method, a system, or a computer program product. Therefore, the present disclosure may use a form of hardware only embodiments, software only embodiments, or embodiments with a combination of software and hardware. Moreover, the present disclosure may use a form of a computer program product that is implemented on one or more computer-usable storage media (including but not limited to a disk memory, a CD-ROM, an optical memory, and the like) that include computer-usable program code.

The present disclosure is described with reference to the flowcharts and/or block diagrams of the method, the device (system), and the computer program product according to the embodiments of the present disclosure. It may be understood that, computer program instructions can implement each procedure and/or block in the flowcharts and/or block diagrams, and a combination of procedures and/or blocks in the flowcharts and/or block diagrams. These computer program instructions may be provided to a general-purpose computer, a special-purpose computer, an embedded processor, or a processor of another programmable data processing device to generate a machine, so that an apparatus configured to implement functions specified in one or more procedures in the flowcharts and/or one or more blocks in the block diagrams is generated by using instructions executed by the general-purpose computer or the processor of another programmable data processing device.

These computer program instructions may also be stored in a computer readable memory that can instruct a computer or any other programmable data processing device to work in a specific manner, so that the instructions stored in the computer readable memory generate an artifact that includes an instruction apparatus. The instruction apparatus implements a specific function in one or more processes in the flowcharts and/or in one or more blocks in the block diagrams.

These computer program instructions may also be loaded onto a computer or another programmable data processing device, so that a series of operations and steps are performed on the computer or the another programmable device, thereby generating computer-implemented processing. Therefore, the instructions executed on the computer or the another programmable device provide steps for implementing a specific function in one or more processes in the flowcharts and/or in one or more blocks in the schematic structural diagrams.

In a typical configuration, a computing device includes one or more processors (CPUs), an input/output interface, a network interface, and an internal memory.

The memory may include a form such as a volatile memory, a Random-Access Memory (RAM) and/or a non-volatile memory such as a Read-Only Memory (ROM) or a flash RAM in a computer-readable medium. The memory is an example of the computer-readable medium.

The computer-readable medium includes a non-volatile medium and a volatile medium, a removable medium and a non-removable medium, which may implement storage of information by using any method or technology. The information may be a computer-readable instruction, a data structure, a program module, or other data. Examples of a storage medium of a computer includes, but is not limited to, a Phase-change Random Access Memory (PRAM), a Static Random Access Memory (SRAM), a Dynamic Random Access Memory (DRAM), or other types of Random Access Memory (RAM), a Read-Only Memory (ROM), an Electrically-Erasable Programmable Read Only Memory (EEPROM), a flash memory or another storage technology, a Compact Disc Read-Only Memory (CD-ROM), a Digital Versatile Disc (DVD) or another optical storage, or a cartridge tape. A magnetic storage of a magnetic tape or a disc, another magnetic storage device, or any other non-transmission medium may be configured to store information that can be accessed by a computing device. Based on the definition in this application, the computer-readable medium does not include transitory computer-readable media (transitory media), such as a modulated data signal and a carrier.

It may be understood that, the embodiments described in the embodiments of the present disclosure may be implemented by using software, hardware, firmware, middleware, microcode, or a combination thereof. For hardware implementation, a processing unit may be implemented in one or more Application Specific Integrated Circuits (ASICs), a Digital Signal Processor (DSP), a DSP device (DSPD), a Programmable Logic Device (PLD), a Field-Programmable Gate Array (FPGA), a general-purpose processor, a controller, a micro-controller, a microprocessor, and other electronic units configured to execute the functions in the present disclosure, or a combination of the above.

For implementation by software, the technologies in the embodiments may be implemented by performing the functional modules (for example, a process and a function) in the embodiments of the present disclosure. Software code may be stored in a memory and executed by a processor. The memory may be implemented inside or outside the processor.

It should also be noted that, in this specification, the terms "include," "comprise" and any other variants mean to cover the non-exclusive inclusion. Thereby, the process, method, article, or device which includes a series of elements not only includes those elements, but also includes other elements which are not clearly listed, or further includes the inherent elements of the process, method, article or device. Unless otherwise specified, an element limited by "include a/an . . . " does not exclude other same elements existing in the process, the method, the article, or the device that includes the element.

Through the descriptions of the foregoing implementations, a person skilled in the art may understand that the methods in the foregoing embodiments may be implemented by software and a necessary general hardware platform, and certainly, may also be implemented by hardware, but in many cases, the former manner is a better implementation. Based on such an understanding, the technical solutions of the present disclosure essentially or the part contributing to the prior art may be implemented in a form of a software product. The computer software product is stored in a storage medium (such as a ROM/RAM, a magnetic disk, or an optical disc) and includes several instructions for instructing a terminal (which may be a mobile phone, a computer, a server, an air conditioner, a network device, or the like) to perform the methods described in the embodiments of the present disclosure.

The embodiments of the present disclosure are described above with reference to the accompanying drawings. However, the present disclosure is not limited to the foregoing specific implementations. The foregoing specific implementations are illustrative instead of limitative. Enlightened by the present disclosure, a person of ordinary skill in the art can make various modifications and changes to the present disclosure without departing from the idea of the present disclosure and the protection scope of the claims. Any modification, equivalent replacement, or improvement made within the spirit and principle of the present invention shall fall within the scope of claims of the present invention.

What is claimed is:

1. A pixel unit, comprising:
a base, the base being provided with an installation space;
a photodiode installed in the installation space, wherein the photodiode comprises a red photodiode, a green photodiode, and a blue photodiode that are spaced apart from each other; and
an optical splitter installed on the base,
wherein at least part of the optical splitter is located in the installation space,
wherein the optical splitter has a light-in surface, a first light-out surface, a second light-out surface, and a third light-out surface,
wherein the optical splitter is configured to disperse light entering the light-in surface and then emit the light from the first light-out surface, the second light-out surface, and the third light-out surface, and
wherein the first light-out surface faces the red photodiode, the second light-out surface faces the green photodiode, and the third light-out surface faces the blue photodiode.

2. The pixel unit according to claim 1, wherein the base comprises:
a bottom plate;
a first lateral panel;
a second lateral panel;
a third lateral panel; and
a fourth lateral panel, wherein the first lateral panel, the second lateral panel, the third lateral panel, and the fourth lateral panel are successively connected into a ring shape and respectively connected to edges of the bottom plate,
wherein the installation space is formed among the bottom plate, the first lateral panel, the second lateral panel, the third lateral panel, and the fourth lateral panel, and
wherein the photodiode and the optical splitter are both installed in the installation space.

3. The pixel unit according to claim 2, wherein the bottom plate, the first lateral panel, and the third lateral panel are respectively provided with one of the red photodiode, the green photodiode, and the blue photodiode.

4. The pixel unit according to claim 1, wherein the base comprises:
a bottom plate;
a first lateral panel; and
a third lateral panel, wherein the first lateral panel and the third lateral panel are arranged opposite to each other and connected to edges of the bottom plate,
wherein the installation space is formed among the bottom plate, the first lateral panel, and the third lateral panel,
wherein the installation space is a concave structure, and
wherein the photodiode and the optical splitter are both installed in the installation space.

5. The pixel unit according to claim 1, wherein a cross section of the optical splitter is in a shape of a trapezoid, a surface in which one base of the trapezoid is located forms the light-in surface, and a surface in which the other base of the trapezoid is located and surfaces in which two legs of the trapezoid are located form one of the first light-out surface, the second light-out surface, and the third light-out surface respectively.

6. The pixel unit according to claim 5, wherein the installation space has a light transmission port communicated with outside,
wherein the optical splitter is installed in the installation space,
wherein the cross section of the optical splitter is in a shape of an isosceles trapezoid, and
wherein the isosceles trapezoid has a lower base facing the light transmission port.

7. The pixel unit according to claim 1, wherein the base is a silicone member.

8. A photoelectric sensor, comprising:
a pixel unit comprising:
  a base, the base being provided with an installation space;
  a photodiode installed in the installation space, wherein the photodiode comprises a red photodiode, a green photodiode, and a blue photodiode that are spaced apart from each other; and
  an optical splitter installed on the base,
  wherein at least part of the optical splitter is located in the installation space,
  wherein the optical splitter has a light-in surface, a first light-out surface, a second light-out surface, and a third light-out surface,
  wherein the optical splitter is configured to disperse light entering the light-in surface and then emit the light from the first light-out surface, the second light-out surface, and the third light-out surface, and
  wherein the first light-out surface faces the red photodiode, the second light-out surface faces the green photodiode, and the third light-out surface faces the blue photodiode; and
a photosensitive control circuit, comprising:
  a first photosensitive control circuit;
  a second photosensitive control circuit; and
  a third photosensitive control circuit, wherein the red photodiode, the green photodiode, and the blue photodiode are respectively connected to the first photosensitive control circuit, the second photosensitive control circuit, and the third photosensitive control circuit to respectively convert received optical signals into electrical signals.

9. The photoelectric sensor according to claim 8, wherein the photosensitive control circuit is disposed on the base.

10. The photoelectric sensor according to claim 8, further comprising a plurality of pixel units being connected and arranged in an array.

11. The photoelectric sensor according to claim 10, wherein adjacent pixel units share the base.

12. A camera module, comprising:
a circuit board;
a lens; and
a photoelectric sensor, wherein the photoelectric sensor is installed on the circuit board and electrically connected to the circuit board, wherein the photoelectric sensor comprising:
  a pixel unit comprising:
    a base, the base being provided with an installation space;
    a photodiode installed in the installation space, wherein the photodiode comprises a red photodiode, a green photodiode, and a blue photodiode that are spaced apart from each other; and
    an optical splitter installed on the base,
    wherein at least part of the optical splitter is located in the installation space,
    wherein the optical splitter has a light-in surface, a first light-out surface, a second light-out surface, and a third light-out surface,
    wherein the optical splitter is configured to disperse light entering the light-in surface and then emit the light from the first light-out surface, the second light-out surface, and the third light-out surface, and
    wherein the first light-out surface faces the red photodiode, the second light-out surface faces the green photodiode, and the third light-out surface faces the blue photodiode; and
  a photosensitive control circuit, comprising:
    a first photosensitive control circuit;
    a second photosensitive control circuit; and
    a third photosensitive control circuit, wherein the red photodiode, the green photodiode, and the blue photodiode are respectively connected to the first photosensitive control circuit, the second photosensitive control circuit, and the third photosensitive control circuit to respectively convert received optical signals into electrical signals, and
  wherein the lens is disposed on one side of the photoelectric sensor away from the circuit board.

13. An electronic device, comprising a camera module, wherein the camera module comprises:
a circuit board;
a lens; and
a photoelectric sensor, wherein the photoelectric sensor is installed on the circuit board and electrically connected to the circuit board, wherein the photoelectric sensor comprising:
  a pixel unit comprising:
    a base, the base being provided with an installation space;
    a photodiode installed in the installation space, wherein the photodiode comprises a red photodiode, a green photodiode, and a blue photodiode that are spaced apart from each other; and
    an optical splitter installed on the base,
    wherein at least part of the optical splitter is located in the installation space,
    wherein the optical splitter has a light-in surface, a first light-out surface, a second light-out surface, and a third light-out surface, wherein the optical splitter is configured to disperse light entering the light-in surface and then emit the light from the first light-out surface, the second light-out surface, and the third light-out surface, and wherein the first light-out surface faces the red photodiode, the second light-out surface faces the green photodiode, and the third light-out surface faces the blue photodiode; and a photosensitive control circuit, comprising:
   a first photosensitive control circuit;
   a second photosensitive control circuit; and
   a third photosensitive control circuit, wherein the red photodiode, the green photodiode, and the blue photodiode are respectively connected to the first photosensitive control circuit, the second photosensitive control circuit, and the third photosensitive control circuit to respectively convert received optical signals into electrical signals, and wherein the lens being disposed on one side of the photoelectric sensor away from the circuit board.

* * * * *